United States Patent [19]

Blank et al.

[11] Patent Number: 5,576,687
[45] Date of Patent: Nov. 19, 1996

[54] VEHICLE INFORMATION DISPLAY

[75] Inventors: Rodney K. Blank, Holland; Ken L. Schierbeek; Jerry L. Beck, both of Zeeland, all of Mich.

[73] Assignee: Donnelly Corporation, Holland, Mich.

[21] Appl. No.: 195,353

[22] Filed: Feb. 10, 1994

Related U.S. Application Data

[63] Continuation-in-part of Ser. No. 142,509, Oct. 25, 1993, which is a continuation-in-part of Ser. No. 811,578, Dec. 20, 1991, Pat. No. 5,255,442.

[51] Int. Cl.$^6$ ...................................... B60Q 1/00
[52] U.S. Cl. ..................... 340/438; 340/457; 340/461; 340/815.55; 362/83.1; 359/839; 359/838; 359/630
[58] Field of Search ............................ 340/438, 464, 340/473, 457, 461, 815.55; 362/83.1; 359/839, 838, 630

[56] References Cited

U.S. PATENT DOCUMENTS

| | | | |
|---|---|---|---|
| Re. 32,576 | 1/1988 | Pastore | 350/600 |
| 1,849,708 | 3/1932 | Colbert et al. . | |
| 1,884,759 | 10/1932 | La Hodny . | |
| 1,908,767 | 5/1933 | La Hodny et al. . | |
| 2,166,303 | 7/1939 | La Hodny et al. . | |
| 2,561,582 | 7/1951 | Marbel . | |
| 3,317,906 | 5/1967 | Baldridge . | |
| 3,574,283 | 4/1971 | Albers . | |
| 4,001,831 | 1/1977 | Harvey | 343/715 |
| 4,109,235 | 8/1978 | Bouthors . | |
| 4,157,166 | 6/1979 | Voelker | 248/102 |
| 4,167,113 | 9/1979 | Mann . | |
| 4,381,142 | 4/1983 | McColgan | 350/314 |
| 4,447,808 | 5/1984 | Marcus | 340/696 |
| 4,474,100 | 10/1984 | Duh . | |
| 4,499,451 | 2/1985 | Suzuki et al. . | |
| 4,588,267 | 5/1986 | Pastore . | |
| 4,694,295 | 9/1987 | Miller et al. | 340/903 |
| 4,715,698 | 12/1987 | Haba | 350/588 |
| 4,793,690 | 12/1988 | Gahan et al. | 350/279 |
| 4,799,768 | 1/1989 | Gahan | 350/279 |
| 4,840,773 | 6/1989 | Wade | 422/124 |
| 4,871,917 | 10/1989 | O'Farrell et al. . | |
| 4,882,565 | 11/1989 | Gallmeyer . | |

(List continued on next page.)

FOREIGN PATENT DOCUMENTS

WO8202448 7/1982 European Pat. Off. .

OTHER PUBLICATIONS

U.S. patent application, Ser. No. 08/022,968, filed Feb. 25, 1993 commonly assigned to Assignee of present invention (no copy required).

Mechanical drawings (1 sheet) and four Polaroid photos illustrating GM Guidematic Dimmer Module mounted to interior rearview mirror mounting bracket by an S-clip dimmer mount attachment made from spring steel. The clip and dimmer module have been on sale more than one year prior to the filing date of the above–identified application.

*Primary Examiner*—Brent A. Swarthout
*Assistant Examiner*—Nina Tong
*Attorney, Agent, or Firm*—Price, Heneveld, Cooper, DeWitt & Litton

[57] ABSTRACT

An information display for use in vehicles including a module or housing located behind, and attached to, a support for the interior rearview mirror assembly. The module includes a display which is observable around the profile of the mirror by the vehicle operator or passengers. An upper portion of the display module is attached to the mount used to support the mirror assembly on the vehicle windshield. The upper portion of the module may be detachably coupled to the mount by a snap-on clip, by a threaded fastener secured directly to the mount, or by a resilient S-clip. The information display of this invention lends itself to quickly and inexpensively adding a wide range of information displays such as a compass, trip computer, clock, warning light, temperature readout, or the like, to any vehicle, at a location readily seen by the vehicle operator within the forward field of vision without substantially interfering or impairing the operator's field of vision.

55 Claims, 6 Drawing Sheets

U.S. PATENT DOCUMENTS

| | | | |
|---|---|---|---|
| 4,886,960 | 12/1989 | Molyneux et al. | 250/209 |
| 4,930,742 | 6/1990 | Schofield et al. | 248/475.1 |
| 4,936,533 | 6/1990 | Adams et al. | |
| 4,943,796 | 7/1990 | Lee | 340/435 |
| 4,993,774 | 2/1991 | Greenhalgh et al. | 296/201 |
| 5,005,895 | 4/1991 | Muyres et al. | 296/97.8 |
| 5,017,903 | 5/1991 | Krippelz | 340/472 |
| 5,037,051 | 8/1991 | Moriello | 248/215 |
| 5,037,182 | 8/1991 | Groves et al. | 359/630 |
| 5,073,012 | 12/1991 | Lynam | |
| 5,115,346 | 5/1992 | Lynam | 359/604 |
| 5,124,549 | 6/1992 | Michaels et al. | |
| 5,140,455 | 8/1992 | Varaprasad et al. | 359/275 |
| 5,142,407 | 8/1992 | Varaprasad et al. | 359/276 |
| 5,151,816 | 9/1992 | Varaprasad et al. | 359/275 |
| 5,193,029 | 3/1993 | Schofield et al. | 359/604 |
| 5,210,655 | 5/1993 | Mishali | 359/850 |
| 5,223,814 | 6/1993 | Suman . | |
| 5,233,115 | 10/1993 | Ueno | 340/464 |
| 5,253,109 | 10/1993 | O'Farrell et al. | |
| 5,255,442 | 10/1993 | Schierbeek et al. | |
| 5,339,529 | 8/1994 | Lindberg | 33/355 R |
| 5,379,198 | 1/1995 | Zhang | 312/83.1 |
| 5,382,780 | 1/1995 | Carmen | 235/384 |
| 5,392,549 | 2/1995 | Castro | 40/518 |
| 5,394,138 | 2/1995 | Stephens | 340/463 |
| 5,432,496 | 7/1995 | Lin | 340/468 |

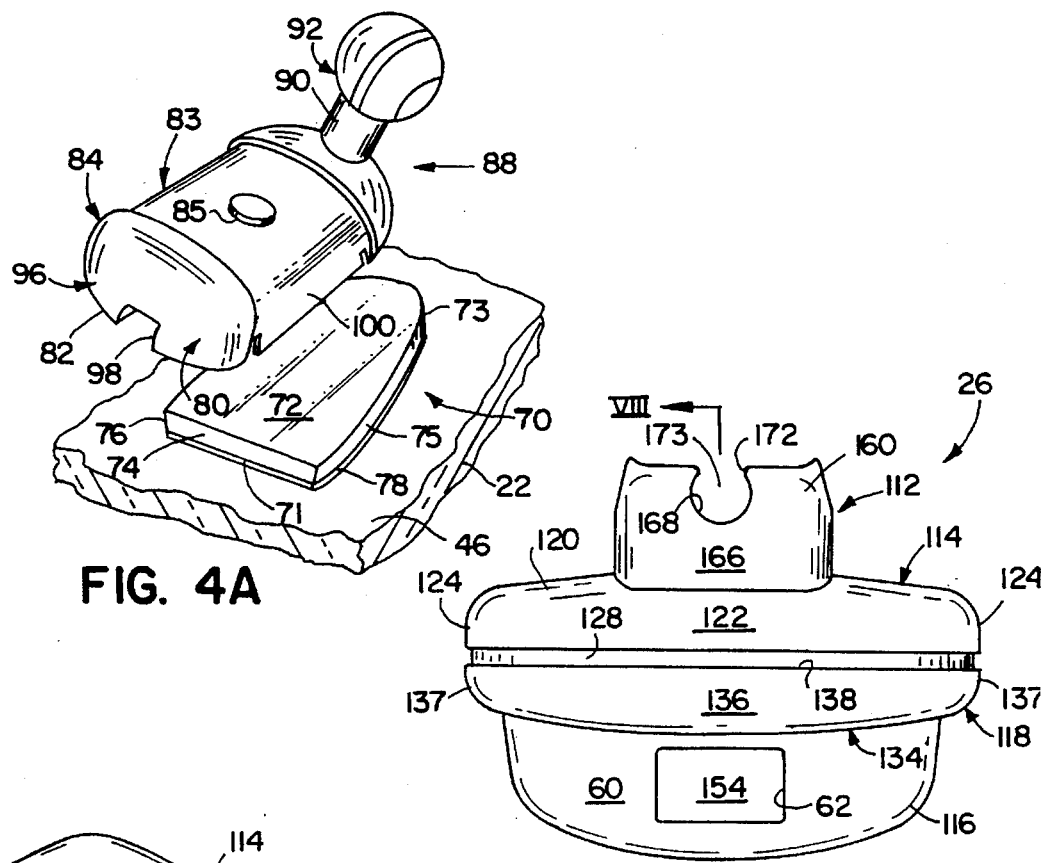
FIG. 4A
FIG. 6
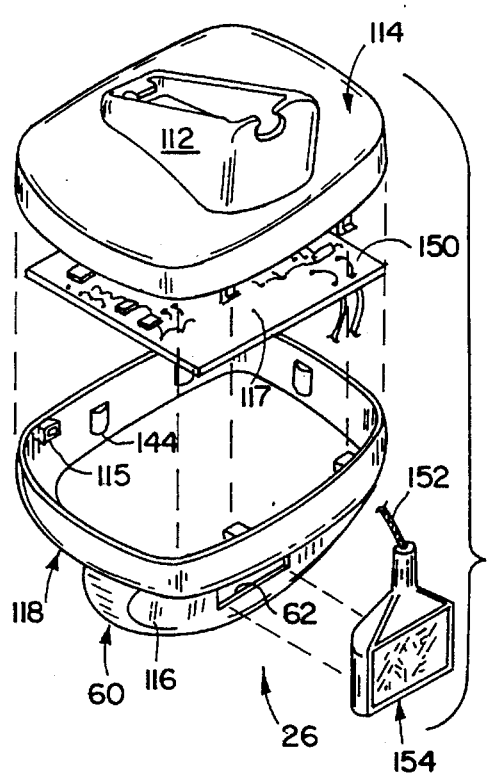
FIG. 4B
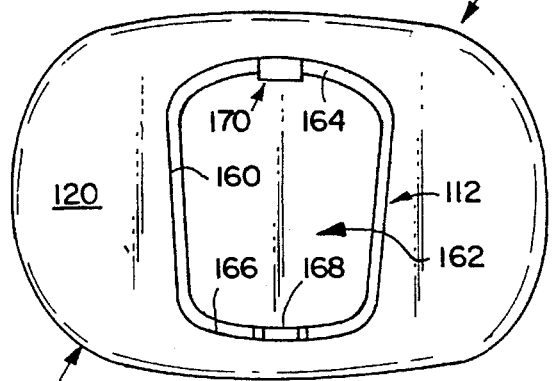
FIG. 7

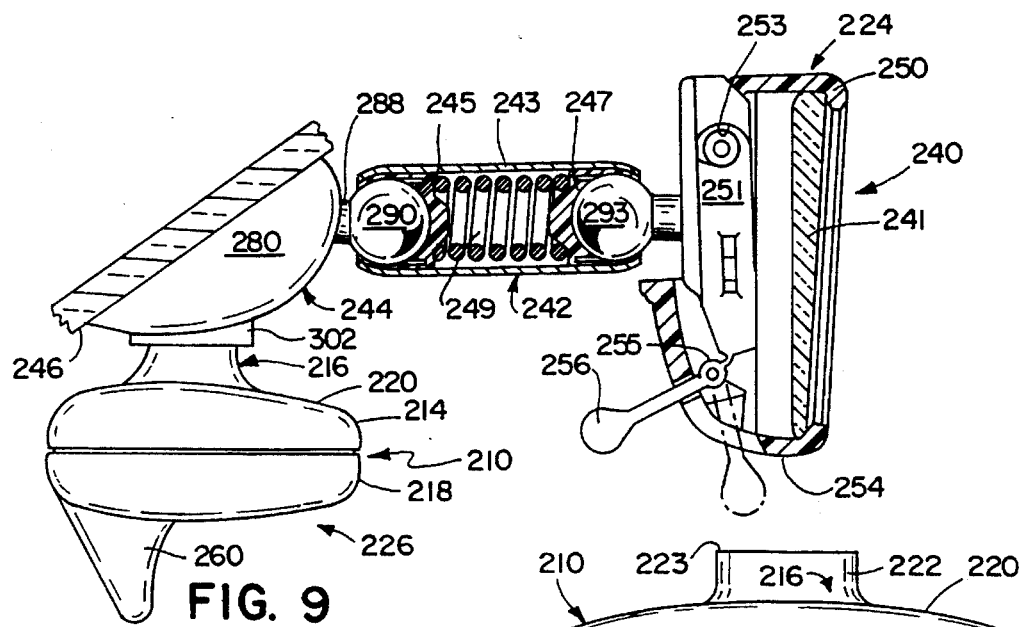
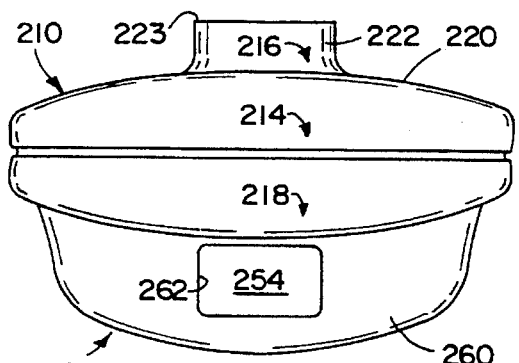
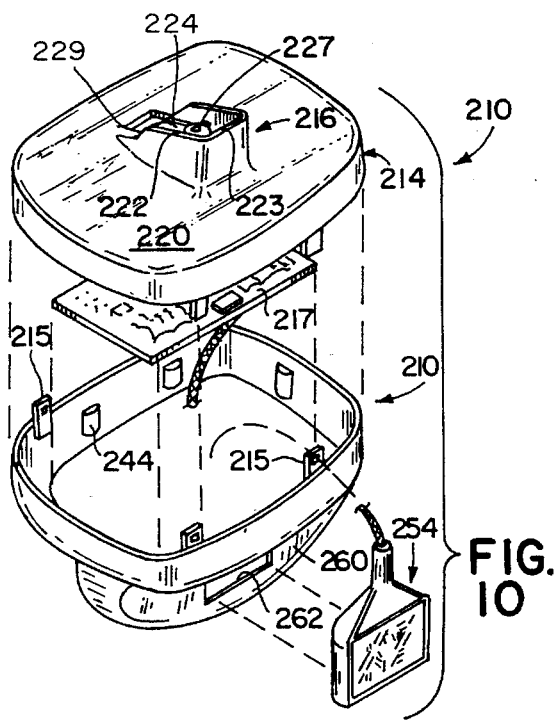
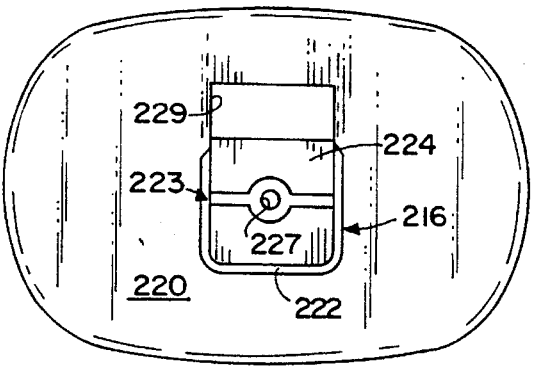

VEHICLE INFORMATION DISPLAY

CROSS REFERENCE TO RELATED APPLICATIONS

This is a continuation-in-part application of copending U.S. patent application Ser. No. 08/142,509 filed Oct. 25, 1993, which is a continuation-in-part of U.S. patent application Ser. No. 07/811,578, filed Dec. 20, 1991, now U.S. Pat. No. 5,255,442, issued Oct. 26, 1993.

FIELD OF THE INVENTION

This invention relates to vehicle information displays, and particularly, to an information display substantially concealed by the rearview mirror and viewable by the vehicle operator and/or passengers.

BACKGROUND OF THE INVENTION

The vehicle instrument panel has typically provided information concerning the operation of the vehicle, time, outside temperature, and the like. Instruments concerning operation of the vehicle have traditionally been located in the panel directly in front of the vehicle operator. Ancillary electronic displays, such as a clock, temperature indicators, and the like, were also located in the panel often to the right of the driver so as to be viewed also by the passengers. In order to view any one or more of the gauges or displays in the panel, the operator looked down to the panel. The location of information displays or gauges in the control panel is undesirable since it requires that the operator redirect his line of sight from the road to the vehicle interior and refocus on the particular gauge. Such a distraction may result in accident or injury when the vehicle operator is presented with an emergency situation.

Certain automobile manufacturers have placed information displays in a console attached to the headliner. The information display is typically located in the portion of the console closest to the windshield. When the vehicle operator references this information, his line of sight is also redirected from the road toward the vehicle roof. In cab-forward designs, the head position of the vehicle operator is moved forward with respect to the windshield/headliner boundary; so that the placement of any displays in the headliner-mounted console will be even more difficult to view.

Recently, automobile manufacturers have implemented a heads-up-display (HUD) which projects information onto the interior of the windshield directly in front of the vehicle operator. However, this technology is still very expensive for automotive applications and is difficult to read during daylight hours, particularly when traveling through rapidly passing shadows or driving toward a rising or setting sun. The information projected onto the windshield often requires adjustment for different driver eye levels which can make viewing of the information difficult for the passengers.

Certain kinds of information displays have also been mounted in the interior rearview mirror of the vehicle. In one case, the display was located behind the prism in a prismatic-type interior rearview mirror assembly and was limited in size so as not to interfere with the viewing area provided by the mirror. In another application, the information display was mounted in the eyebrow portion of the mirror frame so as not to interfere with the field of view of the mirror. A disadvantage associated with these displays is that they are integral with the mirror assembly and expensive. The displays can, thus, not be used with any rearview mirror unless the mirror has a specially designed case which mounts the display. Because the mirror and display are combined into a single unit, the mirror body is also heavier than conventional mirrors without the displays. In many cases, the heavier mirror vibrates or oscillates on its support, making it difficult and annoying for the operator to form a clear image in the rearview mirror. Moreover, because the mirror and display are combined in a single unit, they must be supplied to, and operated by, the owner of the vehicle as a single unit. This limits the option packaging choices available to the original equipment manufacturer.

No one has previously provided an information display which can be readily installed in the windshield area of a vehicle with a conventional prismatic or electrochromic mirror and seen by the vehicle operator and/or passengers without interfering with the field of view and which overcomes the above disadvantages. Moreover, no one has provided such an information display which is mounted forward of the operator to minimize refocusing while simultaneously not obstructing the operator's field of vision.

SUMMARY OF THE INVENTION

Accordingly, one embodiment of the invention provides an information display located within the operator's forward field of vision without substantially interfering with the operator's field of vision. The information display includes a module which is mounted behind, and preferably is at least partially concealed by, and most preferably is substantially concealed by, an interior rearview mirror. The module includes a display window extending from behind the mirror to make it observable by the vehicle operator and/or passengers.

According to one aspect of the invention, the module is coupled to a mount which secures the interior rearview mirror assembly to the interior of the vehicle. The module includes an attachment member which engages the mount to hold the module in place. The module can contain an electrical circuit, preferably on a circuit board, operably coupled to a remote power source and coupled to a display located in the display window of the module. The display window is located in a lobe extending from the module, which lobe positions the display so that it is observable beyond the peripheral edge of the rearview mirror. The module itself is most preferably substantially concealed from the operator and passengers behind the rearview mirror and is preferably located below, and most preferably centrally below, the rearview mirror.

In a preferred form of the invention, the attachment member includes a tab captured in one end of a mirror mount and a clip at the other end to clasp one end of a support arm to hold the module in place. The attachment member is designed to cover a substantial portion of the mount to provide a uniform appearance. The information display is preferably digital and is connected to an electronic compass, trip computer, clock, temperature sensor, vehicle fault detector, or the like.

In another embodiment, the module may be attached to the mirror mount by a fastener such as a screw, VELCRO™ or other releasable hook-and-loop type fastener material, or the like. The upper portion of the module includes a neck portion, which butts against and engages the mount. At least one screw or other fastener extends through the neck to rigidly attach the module to the mount. According to yet another embodiment of the invention, the module may be detachably coupled to the mount by an S-clip which has one end attached to the module and an opposite end received in a space between the mount and the mounting button attached to the vehicle. Alternatively, the module may be clipped or suspended from the support arm interconnecting the rearview mirror to the mount or adhesively attached to the mount, support arm, or both using a pressure-sensitive, thermally-, radiation-, or chemically-cured adhesive, or by mechanical means such as by a VELCRO™ type fastener. In all of the above embodiments, the size of the module and/or display window may vary to provide sufficient space to convey or display the selected information.

Advantages provided by this invention include easily adapting the display to vehicles having rearview mirrors supported in the windshield area, either on a windshield-mounted button, or a header-mounted bracket suspended from the vehicle roof. The display is located in the operator's forward field of vision inside the windshield and as far away from the operator as possible, thus requiring a lesser degree of refocusing than required to view displays in the instrument panel or in the headliner/overhead console. The operator can also easily view the information without taking his eyes from the road. Furthermore, the module provides many more options with respect to the types of displays than those contained in conventional mirror-mounted displays, thus removing a substantial weight from the mirror, making the mirror less susceptible to vibration and allowing use of displays with a wide variety and price range of rearview mirrors.

BRIEF DESCRIPTION OF THE DRAWING FIGURES

A better understanding of the invention and the advantages provided thereby may be obtained by reference to the specification and the attached drawing figures, wherein:

FIG. 4A is a perspective view of one embodiment of an interior rearview mirror mount;

FIG. 4B is an exploded view of the information display assembly shown in FIGS. 2 and 3B;

FIGS. 6–8 are front, top, and side sectional views, respectively, of the information display assembly shown in FIG. 4B;

FIG. 9 is a side elevation shown in partial section of an alternate embodiment of the interior rearview mirror and information display assembly including a manual, prismatic, day/night rearview mirror;

FIG. 10 is an exploded view of the alternate embodiment of the information display assembly shown in FIG. 9;

FIGS. 11–13 are from, top, and partial-side sectional views, respectively, of the information display shown in FIGS. 9 and 10;

DETAILED DESCRIPTION OF PREFERRED EMBODIMENTS

Figure 1:
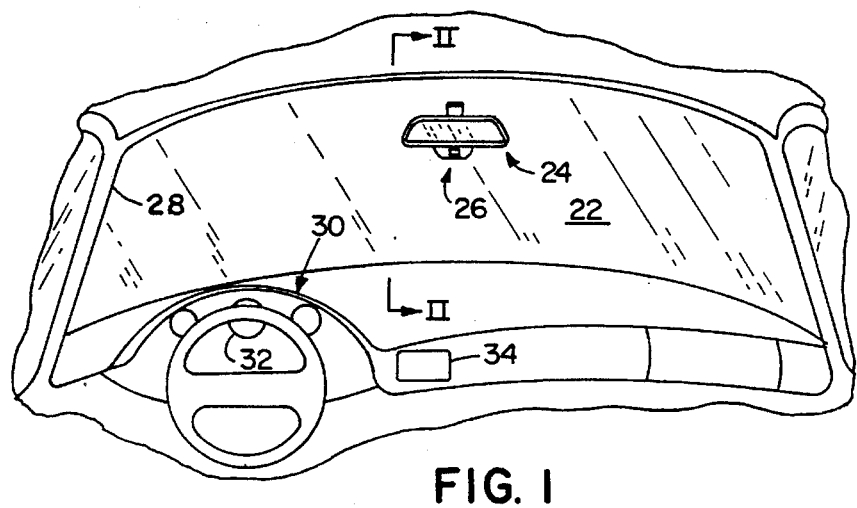
FIG. 1 is an elevational view, from the interior of the vehicle through the windshield, of the display of the present invention mounted behind a rearview mirror.

For the purposes of the following description, the terms "upper," "lower," "right," "left," "from," "rear," "vertical," "horizontal," and derivatives or equivalents thereof shall relate to the invention as oriented in FIG. 1. It is understood that the invention may assume various alternative orientations, except where expressly specified to the contrary. It is also understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered limiting unless the claims expressly state otherwise.

The invention is applicable to a wide variety of interior rearview mirrors including manually operated, prismatic day/night mirrors, such as described in U.S. Pat. Nos. 4,826,289 and 4,936,533; electrically operated, prismatic day/night mirrors such as described in U.S. Pat. No. 4,948,242; electrically operated, compass mirrors such as that described in U.S. Pat. No. 5,253,109; electrically operated, interior rearview mirrors incorporating map/reading lights such as those described in U.S. Pat. Nos. 4,646,210; 4,733,336; 4,807,096; and 5,178,448; electrically operated, automatically dimming mirrors such as described in U.S. Pat. Nos. 4,793,690; 4,799,768; 4,886,960; and 5,193,029; and electrically operated memory interior rearview mirrors. This invention is particularly advantageous when used in conjunction with electrically operated interior rearview mirrors integrally incorporating features including map lights, automatic dimming circuitry, etc., as such added features necessarily limit the space available within the mirror case cavity. For example, this present invention is useful in conjunction with electrochromic rearview mirror assemblies such as automatic dimming rearview mirrors using an electrochromic element such as of the electrochemichromic type as the variable light-transmitting element. Suitable electrochromic elements are described in U.S. Pat. Nos. 5,151,816; 5,142,407; and 5,140,455. Use of the module comprising the instant invention in conjunction with electrically operated interior rearview mirrors has the further advantage of permitting electrical coupling of the module to the power supply of the vehicle by the preexisting wire harness serving the rearview mirror. Thus, the electrical coupling of the module can be by direct connection to the existing wire harness or in parallel through an adapter plug for receiving the existing plug and connecting the mirror. This particularly facilitates a retrofit such as might occur as on the aftermarket or at the dealership as a result of an option selection.

Figure 2:
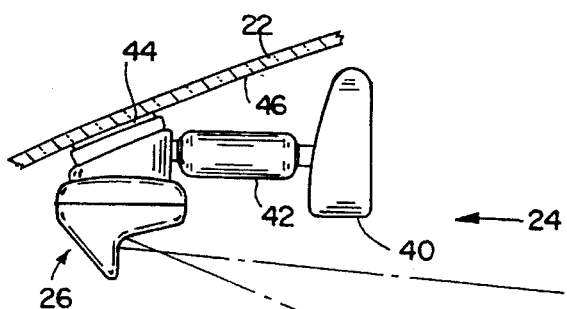
FIG. 2 is a fragmentary, sectional view of the vehicle windshield area taken along line II—II in FIG. 1 and showing the present invention.

Referring to FIGS. 1 and 2, the operator of the vehicle is positioned behind and looks out through a windshield 22. Located in the upper central portion of windshield 22 is an interior rearview mirror assembly 24 and one embodiment of an information display 26 described in greater detail below. Below windshield 22 is an instrument panel 30 containing a conventional speedometer 32 and other displays such as indicated by 34. For the purposes of this discussion, the operator's forward field of vision will be defined as that area within windshield boundary or viewing area 28.

Interior rearview mirror assembly 24 includes a rearview mirror 40 interconnected by a support arm 42 to a mount 44 coupled to the interior surface 46 of windshield 22. Attached to mount 44 and dependent therefrom is one embodiment 26 of an information display assembly positioned such that a lower portion is observable below mirror 40 by an operator and/or passenger of the vehicle. Shown as 48 in FIG. 2 is an "Eyellipse" defined by the Society of Automotive Engineers (SAE) Recommended Practice J941, which preferably includes the eye position of the 90th percentile level of drivers, more preferably the 95th percentile level, and most preferably the 99th percentile level. Vehicle manufacturers use this statistical information to determine where rearview mirror assembly 24 should be located without obstructing the operator's forward field of vision.

Figure 3A:
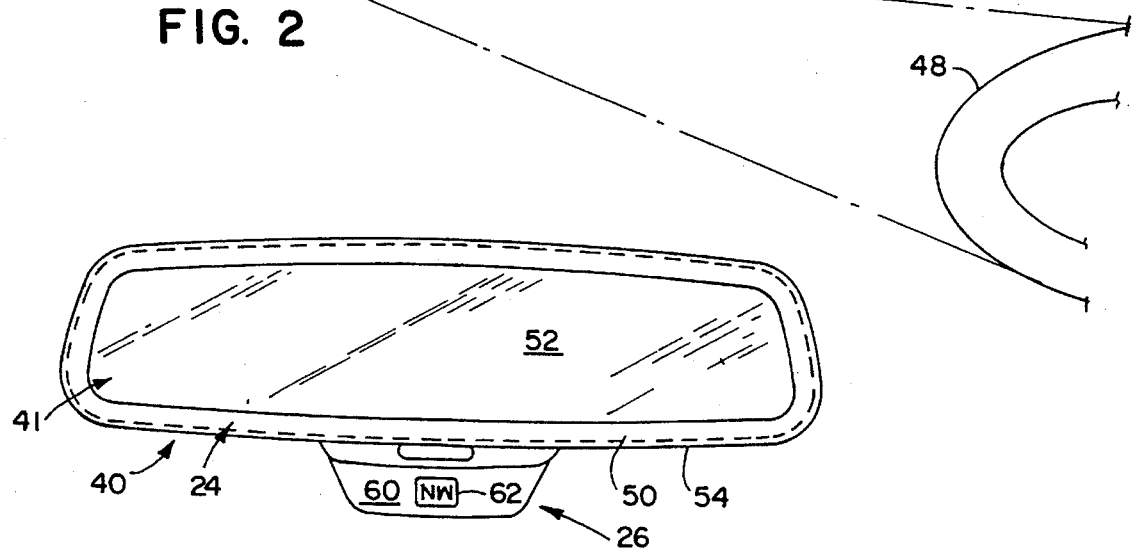
FIG. 3A is an enlarged, elevational view of an interior rearview mirror and one embodiment of the information display of this invention.
Figure 3B:
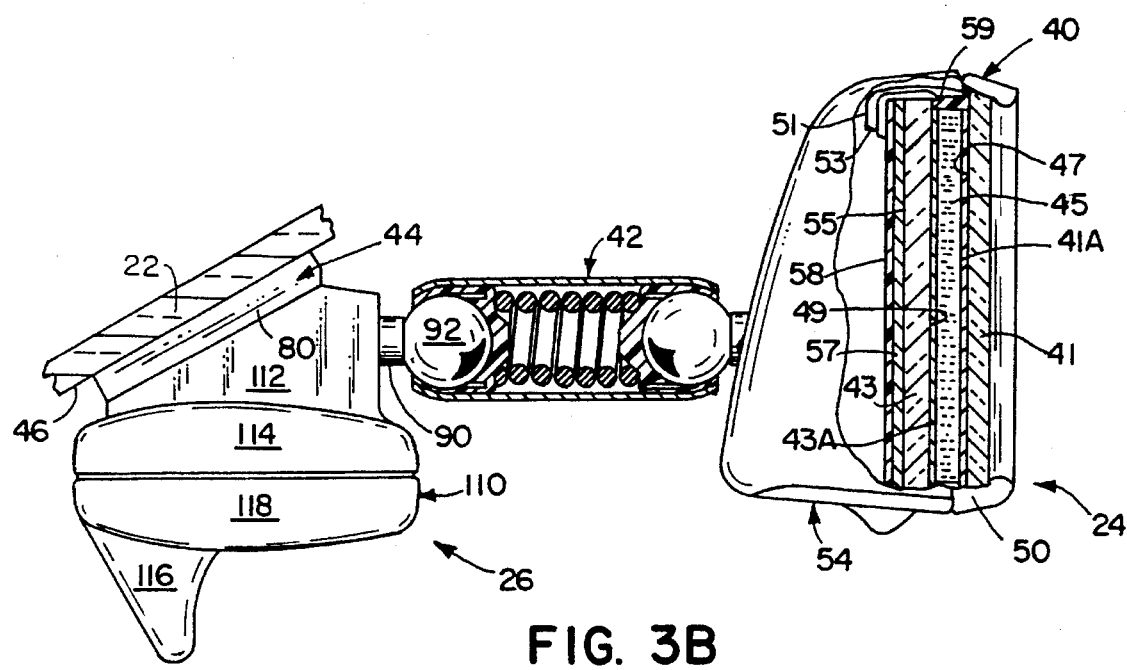
FIG. 3B is a side elevational view of one embodiment of the interior rearview mirror and information display assembly secured to a windshield-mounted button, and including fragmentary, sectional views of an electrochromic mirror and support arm.
Figure 3C:
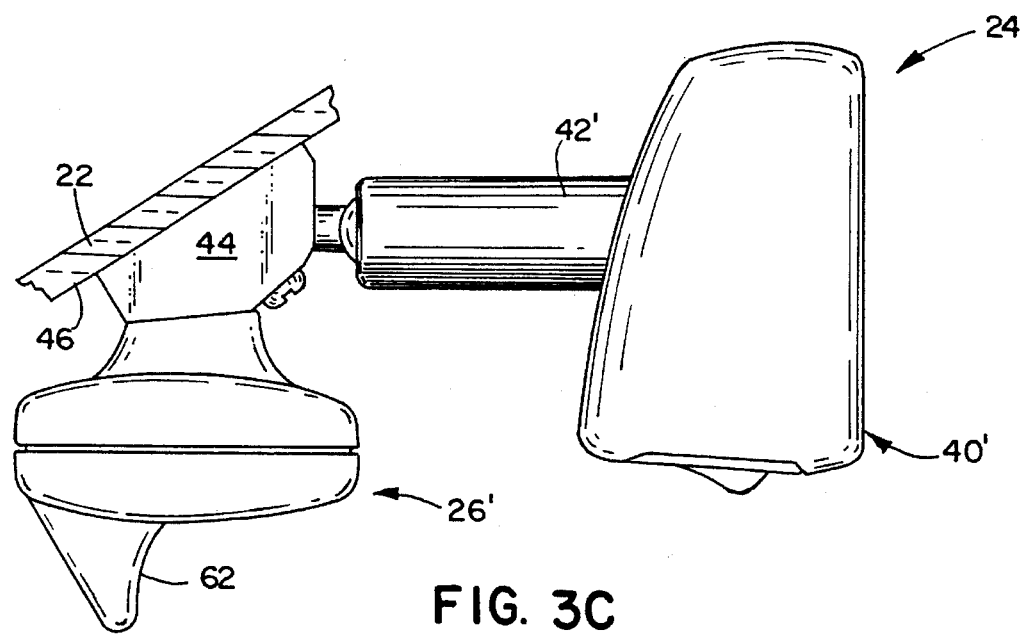
FIG. 3C is a side elevational view of an alternate embodiment of the interior rearview mirror and information display shown in FIG. 3A.

FIGS. 3A, 3B, and 3C better illustrate the spacial relationship of interior rearview mirror assembly 24 with respect to information display assembly 26. FIG. 3C illustrates an alternate embodiment of an interior rearview mirror assembly including an alternate embodiment 26' of module 26 and described in greater detail below. As in the other embodiments, module 26' is supported on the mirror mounting bracket 44 such that display 62 (not shown) is viewable below the mirror 40'. In the embodiment of FIGS. 3A and 3B, where dimensions are exaggerated for clarity, mirror assembly 40 includes a front glass element 41 formed from one of several types of glass including conventional soda lime glass. Examples include those which absorb ultraviolet radiation and have a higher iron oxide content than soda lime glass. Spaced from element 41 (FIG. 3B) is a second glass element 43 made from a similar type of glass, and together with element 41, defines a gap or space 45 (greatly exaggerated in the drawing figures) for receiving an electro-optic medium described below. Preferably, each of the rear surface 47 of front element 41 and the front surface 49 of rear element 43 is coated with a layer of a transparent, electrically conducting material such as indium tin oxide (ITO) 41a, 43a which is substantially transparent to incident visible light yet is sufficiently electrically conductive to enable application of an electric field or voltage across space 45 between ITO layers 41a, 43a. Electrical energy is provided by wire leads 51, 53 secured in a conventional manner to ITO coatings. The rear surface 55 of rear glass element 43 is coated with a reflective layer 57 preferably made from a metallic material such as aluminum, or a combination of silver and copper, which layer 57 may itself be covered with a protective coating 58.

In order to confine and retain the electro-optic medium in space 45, a peripheral seal 59, formed from an epoxy material which adheres well, when cured, to the ITO coatings, is applied adjacent the periphery of glass elements 41, 43. The epoxy is preferably silk screened onto the inner surface 47 of the front glass element 41 or the back glass element 43 or onto both glass elements. The corresponding glass element is then placed face-to-face with the still tacky epoxy. Seal 59 is then allowed to cure and the space 45 may be filled by a variety of ways including simple injection of electro-optically active material using a syringe or by vacuum backfilling. A variety of electro-optic material may be used in space 45, including those described in U.S. Pat. No. 5,115,346 or in Society of Automotive Engineers Technical Paper 870636 entitled "Electrochromic Automotive Day/Night Mirrors" by Niall Lynam, published Feb. 23–27, 1987, the disclosure of which is incorporated herein by reference.

Figure 5:
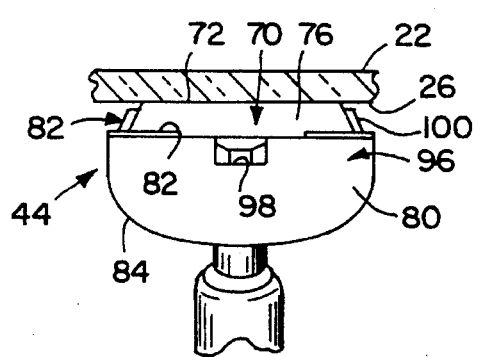
FIG. 5 is an end view of the interior rearview mirror mount and windshield-mounted mounting button.

Assembly 40 is preferably incorporated in a molded thermoplastic or other mirror case or frame 50 of conventional form and supported within the vehicle as described above. Mount 44 is preferably fastened to windshield inner surface 46 by a conventional double-tapered mounting button 70 (FIGS. 4A and 5). Button 70 may include generally planar parallel front and rear surfaces 71, 72; top and bottom ends 73, 74; and opposing side surfaces 75, 76. Button 70 can be made from a variety of materials such as sintered metal, engineering plastic (such as glass or mineral-filled nylon), zinc, or aluminum. Front surface 71 is adapted to be adhered to the interior surface 46 of windshield 22 using a suitable adhesive 78. One specific example is a clear, PVB adhesive available from the Monsanto Company of St. Louis, Mo. Thus, peripheral edges 75, 76 and opposite surface 72 of button 70 are free and exposed. The peripheral edges 75, 76 of mounting button 70 may be beveled or chamfered inwardly toward windshield inner surface 46 to slidably receive mount 44 thereon and retain it in place. The opposite surface 72 is adapted to slidingly receive a surface of coupler 80 described more fully below. In order to allow such sliding installation, button 70 includes a double taper provided by side surfaces 75, 76 converging from bottom end 74 toward top end 73. Surfaces 75, 76 are also inclined inwardly toward the inner windshield surface and surface 72 in a manner similar to that shown in FIGS. 4A and 5.

Referring to FIGS. 4A and 5, mount 44 includes a coupler body 80 having a base contact or bottom surface 82 adapted to slidingly receive button 70 during installation, an outer, exposed, exterior surface 84 receives a retaining band 83, and a rearview mirror/accessory support 88 including a neck 90 terminating in a ball member 92. Ball member 92 is commonly swaged within one end 94 of support arm 42 (FIG. 3B). Defined at a lower end 96 of coupler 80 is a recess 98 to allow insertion of a screwdriver blade or other tool to facilitate removal of the coupler 80 from button 70 when desired after installation. Retaining band 83 is preferably a resilient, flexible, spring clamp securely attached to exterior surface 84 such as by rivet 85. Ends 100 of band 83 extend about coupler 80 toward bottom surface 82 and are arranged to clamp on peripheral edges 75, 76 of button 70 to retain mount 44 thereon. Extending from bottom surface 82 are walls or shoulders (not shown) which confine the coupler body laterally and longitudinally on button 70. Accordingly, as is best seen in FIG. 5, button 70 is adapted to be received between the ends 100 of band 83 which holds the coupler 80 against button 70. The force of the converging ends 100 of retaining band 83 urge coupler 80 against button 70 and, together with the walls or shoulders mentioned above, prevent twisting or rotational motion of coupler 80 after installation. Details of the mount 44 and its coupling relationship with mounting button 70 and support arm 42 are described in copending, commonly assigned, U.S. patent application Ser. No. 022,968, filed Feb. 25, 1993, the disclosure of which is hereby incorporated by reference herein.

Information display assembly 26 (FIGS. 3B, 4B, and 6–8) includes a housing 110 having an attachment member 112 extending from an upper portion 114 and a lobe 116 extending from a lower portion 118 and defining portion 60 described above. Housing 110 preferably has a low profile having a height less than either its length or width so that it can be concealed behind the outline 54 of mirror 40. It is further preferred that housing 110 be made from two pieces 114, 118, preferably of a molded polymeric material such as polypropylene, ABS, nylon, or the like. The injection molding process permits the formation of one or more bosses 144 and tabs 115 in the module interior chamber to add strength, facilitate assembly, provide seating and placement of circuit board 150 and display 154, and provide fastening of the upper portion 114 with lower portion 118.

Figure 8:
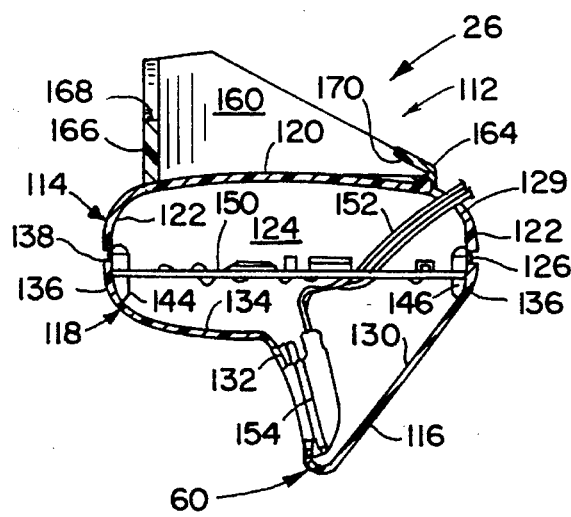

Referring to FIGS. 6–8, housing upper portion 114 includes an upper wall 120 which may be flat or gently curved and which preferably terminates in four downwardly extending sidewalls such as 122, 124. Sidewalls 122, 124, in turn, terminate in a lower peripheral edge 126 which defines a skirt 128 dependent therefrom and received in housing lower portion 118. Housing lower portion 118 includes a lower or bottom wall 130 which defines lobe 116, display face 132, and a recessed portion 134 above display face 132. Bottom wall 130 extends upwardly terminating in a corresponding number of walls 136, 137 having an upper peripheral edge 138 designed to mate with peripheral edge 126 and partially receive skirt 128.

Portions 114, 118 are detachably coupled to each other to form housing 110. Any one of a number of coupling schemes may be employed including clips extending upwardly from portion 118 which cooperatively join with tabs extending downwardly from skirt 128. In this manner, housing 110 can be opened for servicing if need be and reassembled. Also defined on the interior of housing portions 114, 118 are bosses and guides 144 to receive and position a circuit-containing board 150 which is coupled to and powered by a remote power source (not shown) through a conductor 152 extending through housing 110. An information display 154 is, in turn, operably coupled to conductor 152 and circuit board 150 and is mechanically fixed in window 62 by screws, friction coupling, or the like.

In one embodiment of the invention, a compass circuit is located in module 26 secured below the mounting arm and bracket 42, 44 for the rearview mirror 40. The module is positioned in relation to an electrochromic (FIG. 3B) or prismatic mirror (FIG. 9) so that the vehicle heading may be displayed behind and below the mirror and viewable through a transparent area of display window 62 by the driver and all passengers in the vehicle. FIGS. 4B and 10 depict an integrated compass module which houses the electronic circuit of the compass and also the display 154 or 254. A stand-alone compass module may be mounted similarly and supply directional information to other vehicle systems for display or navigational purposes. Circuit board 150 in FIG. 4A may be configured for any one of a number of other displays, including: a clock, an odometer, a speed indicator, a hazard warning indicator, a turn indicator, a thermometer (both interior and exterior), a trip computer, a global positioning satellite (GPS) system, a cellular telephone, a supplemental vision system (including camera, sonar, infrared and microwave detection), and/or warning lights (such as a low fuel indicator), and other indicia. Display 154 operably coupled to circuit board 150 may be any one of a number of types of electronic displays including liquid crystal displays (both negative and positive modes), light-emitting diodes, vacuum fluorescent, gas discharge, cathode-ray tube, or plasma display. Display 154 may be analog, digital, or both. A similar display may also be used for displaying compass information, although it is anticipated that the information is displayed by an alpha character such as SW, NE, NW, E, etc. An example of an electronic compass suitable for use in module 26 is disclosed in related U.S. Pat. No. 5,255,442, the disclosure of which is hereby incorporated by reference herein.

As is best seen in FIGS. 6–8, one embodiment of attachment member or clip 112 extending from upper wall 120 includes a wall 160 which defines a cavity 162 for receiving coupler body 80 described above. Wall 160 has a low profile at one end 164 and increases in height to an opposite end 166. Centrally defined at the upper end 166 is a circular recess or clip 168. A tab 170 is centrally located at the opposite end and extends at an upward angle from wall 120 into cavity 162. Tab 170 is adapted to be received in slot or recess 98 defined at the lower end 96 of coupler body 80 while circular recess 168 has a diameter adapted to receive neck portion 90 extending from mount 44 in a snap-fit fashion. Opposed shoulders 172 at the top of recess 168 form a partial circle with a neck receiving opening 173 slightly smaller than the diameter of neck 90 and allow attachment member 112 to be detachably coupled on neck 90. Cavity 162 defined by wall 160 is of sufficient size and depth to substantially surround and enclose mount 44 when attached thereto as shown in FIG. 3B.

FIGS. 9–13 illustrate an alternate embodiment of information display assembly 226 similar to module 26' in FIG. 3C and its coupling with mount 244, as well as an alternate embodiment 240 of the rearview mirror assembly. For example, mirror assembly 240 may be a manually operated, prismatic day/night rearview mirror which includes a mirror case having a bezel or frame 250 surrounding and enclosing a mirror prism 241. Mirror assembly 240 is preferably located within the uppermost central portion of the field of view, defined by boundary 28 (FIG. 1). A day/night toggle-type actuator lever 256 maybe located along the bottom center of mirror frame 250 which also extends slightly from peripheral edge 254 to permit the operator to change the reflection angle of prism 241 for day or night driving. Information display assembly 226 is shown behind mirror assembly 240 such that a portion 260 containing a display window 262 is viewed below the lower peripheral edge 254 and below day/night toggle 256. This relationship is unchanged so long as mirror 240 is generally horizontal for the vehicle operator; although, each specific operator can make necessary adjustments for proper viewing using ball swivel members 290, 293 or a combination thereof as described below.

The alternate embodiment of rearview mirror assembly 240, best seen in FIG. 9, may include a support arm 242 having a swaged, one-piece tubular member 243 enclosing two plastic ball cups 245, 247 forced outwardly by a compression spring 249 against the ends of tubular member 243, and ball member 293 extending rearwardly from rearview mirror assembly 240. Ball member 293 may project from a pivot actuator 251 rotatably mounted within rearview mirror assembly 240 on pivot shafts 253. Case or frame 250 encloses and retains mirror/element 241 such as a prism having nonparallel front and back surfaces. A pivot lever or toggle 256, supported on a lower set of pivot shafts 255 and joined or engaged with the lower edge of pivot actuator 251, may be moved back and forth to pivot housing 250 and mirror element 241 between day and night reflective positions about shafts 253. In the day position, substantially all of the light entering the vehicle from the rear is reflected to the eyes of the driver/operator, while in the night position, only a significantly reduced amount of light is so reflected, thereby reducing glare and improving the operator's night vision.

Coupler 280 (FIGS. 9, 13, and 14) is preferably die cast from zinc or molded from a suitable, resinous polymeric material and includes a slightly tapered body having a base or bottom surface 285 adapted to slidingly receive a windshield mounted button such as that described at 70 above during installation, an outer exterior surface 287, and a rearview mirror/accessory support 286 including a neck 288 and a ball member 290. Projecting from the same side of coupler 280 on which surface 285 is located are a pair of inwardly inclined, converging spaced walls 292 between which button 70 is confined after mount 244 is installed. The spaced walls 292 follow the general rounded shape of the upper end 276 of coupler 280 and extend along the sides of coupler 280 to laterally confine button 70 when installed. Between spaced walls 292 is a cavity or recess which reduces the overall weight and material cost.

Figure 13:
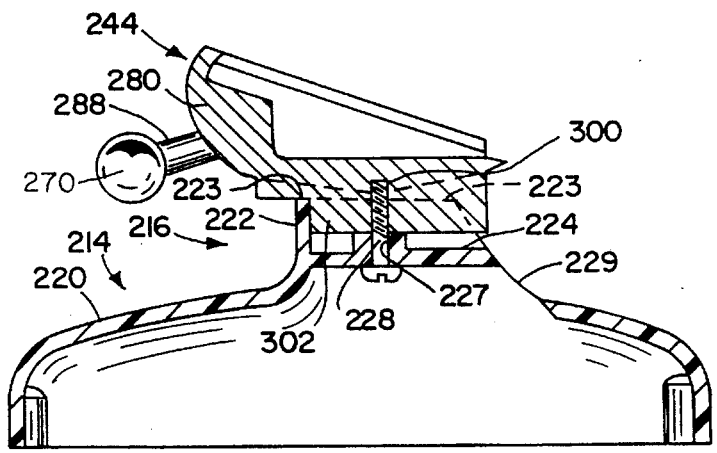
Figure 14:
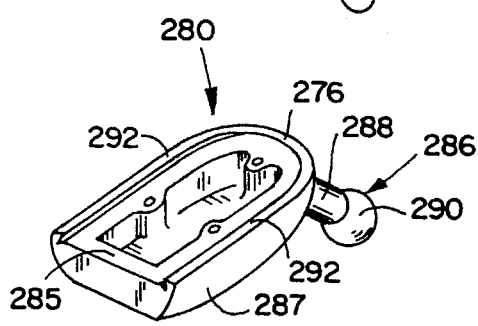
FIG. 14 illustrates an alternate embodiment of an interior rearview mirror channel mount used in association with this invention.

Information display assembly 226 includes a housing 210 having an upper portion 214 closed by a lower portion 218. Portion 218 is substantially identical to lower portion 118 described above. Upper portion 214 includes a neck portion 216 extending from an upper wall 220. Neck 216 is formed from a three-sided wall 222 generally surrounding a floor 224 (FIGS. 12 and 13). Passing through floor 224 is a hole 227 for receiving a shafted fastener 228 such as a screw (FIG. 13), Christmas-tree fastener, or the like which extends into a hole 300 in mount 244. Fastener 228 draws the upper edge 223 of wall 222 tightly against the outer exterior surface 287 of mount 244. It is contemplated that exterior surface 287 of mount 244 may have a projection or boss 302 defined thereon (FIG. 10) which is received between walls 222 and against floor 224 of neck 216. Boss 302 would properly position assembly 226 thereon and would also serve to strengthen the coupling between the two components.

In operation, the information display assembly is attached to the interior mirror assembly in a way such that the information display window is fully viewable outside the peripheral edge of the mirror frame, while the bulk of the display assembly including housing assembly 110 or 210, is concealed from the operator's line of sight by the mirror itself, as shown in FIG. 3A. Only that portion of the assembly containing the display is viewable during normal operation of the vehicle. The double-ball joint rearview mirror mounting arm 42, or other adjustable mounting arms, may be used to position mirrors 40, 240 to accomplish such relationship for various sizes of drivers. If the information display assembly is coupled or otherwise connected to a remote device, a conductor or cable extends through a hole formed in the upper wall of the housing upper portion such as aperture 129 or 229 (FIGS. 8 and 13), and extends either upwardly along the interior of the windshield to the headliner where it is routed to the appropriate location or is coupled to an electrically operated mirror, if used. For example, one such remote device may include a power source, one or more temperature sensors, or other device unable to be wholly retained within the display housing.

In the embodiment of FIGS. 3B, 4B, and 6–8 including attachment member 112 extending from the upper portion 114 of housing 110, tab 170 is placed inside recess 88 defined in the end of coupler 80 and held therein while the opposite end of attachment member 112 is snapped over the neck portion 90 and held tightly thereon. Wall 160 containing tab 170 and clip 168 substantially encloses coupler 80 to provide an aesthetically appealing and clean assembly. In the case of the alternate embodiment shown in FIGS. 9–13, the upper portion 214 is rigidly attached to mount 244 by fastener 228 extending through hole 227 in floor 224. If provided, neck portion 216 is located by boss 302 extending from coupler 280. Once in place, the lower portion 118 or 218 is snapped into place and the respective conductors, if necessary, are run to their respective locations.

Figure 16:
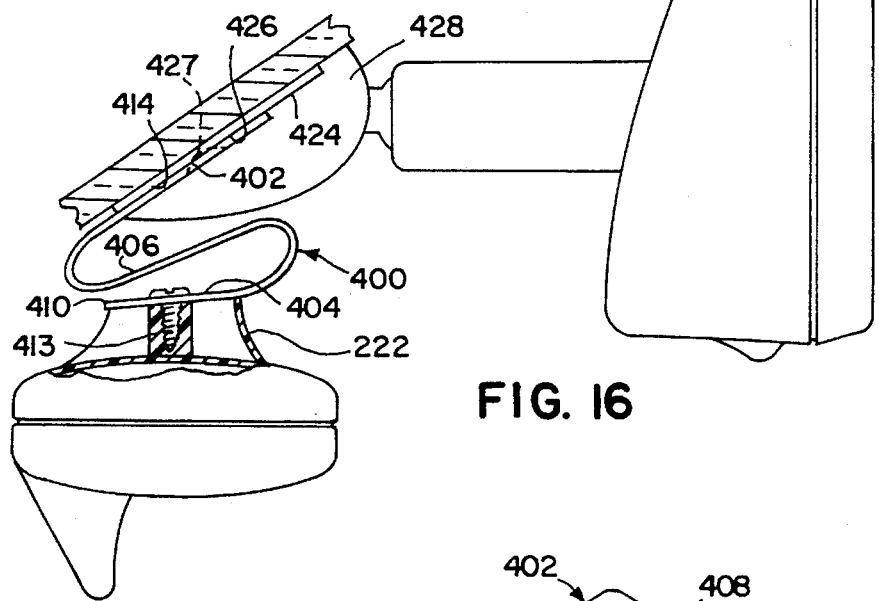
FIGS. 15–16 are perspective and side elevation views of an alternate embodiment of an attachment member for coupling the information display of the present invention to a windshield-mounted channel mount for an interior rearview mirror.
Figure 15:
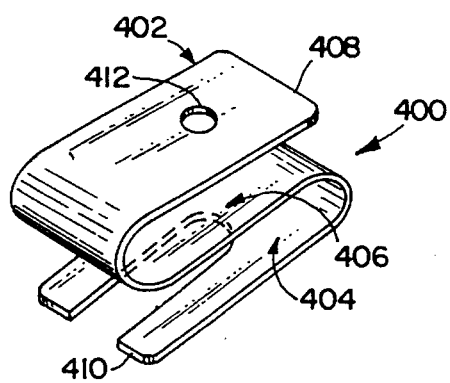

An alternate embodiment for mounting the information display assemblies described above includes the use of a resilient S-shaped spring clip 400 shown in FIG. 15. Clip 400 is preferably made from 0.125 inch thick spring steel and formed such that clip arms 402, 404 are generally adjacent spine 406. Ends 408, 410 are slightly turned upward away from spine 406 to facilitate engagement. Each end 408, 410 may also contain a hole or slot 412 in order to receive a fastener for attaching the respective end to a surface. The fastener may be any one of a number of mechanical fasteners including permanent or releasable fasteners, such as screws, rivets, VELCRO™ fastening material, and the like. For example in FIG. 16, one end 410 of clip 400 may be rigidly attached to neck portion 216 of housing 210 by a fastener 413 extending through floor 224. The end 410 is preferably constrained by walls 222. With end 410 rigidly attached to housing 210, the opposite end 408 of clip 400 is slidably received and held in a space 414 between coupler base or bottom surface 424 and a first surface 426 of mounting button 428. The spatial relationship between bottom surface 428 and button surface 426 is such that end 408 is tightly held therebetween by a friction coupling. Alternately, a projection 427 on coupler base 424 (FIG. 16) may also extend into hole 412 to help hold clip 400 in place. This coupling arrangement easily lends itself for use in substantially any vehicle having an interior rearview mirror assembly attached to the windshield by a mounting button, such as button 428. Also when used with interior rearview mirrors, which include a double-ball mount with one pivot ball located at that end of the channel adjacent the mounting button and the second pivot ball located at the end of the channel adjacent the case of the mirror assembly, the present invention optionally allows alignment of the display relative to the symmetry of the vehicle different from, and optionally independent from, the alignment of the mirror reflective element in the mirror case. Also, the benefit of this present invention can be obtained by attachment of the module to a rearview mirror assembly at a location by a means other than by coupling to the mirror mount. For example, the benefits can be obtained by coupling to the support member or to the bottom, rear, or top of the mirror frame. Also, the benefits of this invention can be enjoyed by the operator and/or the occupant of the vehicle.

The above description is considered that of the preferred embodiments only. Modification of the invention will occur to those skilled in the art and to those who make and use the invention. Therefore, it is understood that the embodiments shown in the drawings and described above are merely for illustrative purposes and are not intended to limit the scope of the invention, which is defined by the following claims.

The embodiments of the invention in which an exclusive property or privilege is claimed are defined as follows:

1. An information display for use in a vehicle, comprising:
   a module adapted for mounting behind and separate from an interior mirror assembly and having a display window adapted to extend from behind the mirror assembly and observable by an occupant of the vehicle when said module is mounted in the vehicle;
   said module includes a housing separate and apart from said mirror assembly;
   said housing includes a first portion adapted for attachment to said interior rear-view mirror assembly;

said first portion of said housing includes a couple for engaging a mount for supporting said interior rearview mirror assembly; and said coupler includes a tab at one end for catching said mount, and a clip at another end to engage a portion of said interior rearview mirror assembly.

2. The information display as defined in claim 1, including said module adapted for mounting behind and at least partially concealed by said interior rearview mirror assembly.

3. The information display as defined in claim 1, including said module adapted for mounting behind and substantially concealed by said interior rearview mirror assembly.

4. The information display as defined in claim 1, further including:

a circuit disposed within said housing;

a conductor means for connecting said circuit to a remote power source; and a display element disposed within said housing and positioned within said display window, said display element powered by said circuit.

5. The information display as defined in claim 4, wherein said display element includes a vacuum fluorescent display.

6. The information display as defined in claim 4, wherein said display element includes a light-emitting diode display.

7. The information display as defined in claim 4, wherein said display element includes a liquid crystal display.

8. The information display as defined in claim 4, wherein said circuit and display include an electronic compass.

9. The information display as defined in claim 4, wherein said circuit and display include a trip computer.

10. The information display as defined in claim 4, wherein said circuit and display include a clock.

11. The information display as defined in claim 4, wherein said circuit and display include a global positioning system.

12. The information display as defined in claim 4, wherein said circuit and display include a thermometer.

13. The information display as defined in claim 4, wherein said circuit and display include a warning indicator.

14. The information display as defined in claim 1, wherein said housing further includes a second portion closing said first portion.

15. The information display as defined in claim 14, wherein said second portion of said housing further includes a face extending outwardly from a lower surface of said second portion, said face containing said display window and positioned such that said display window is observable beyond a peripheral edge of said rearview mirror assembly.

16. The information display as defined in claim 1, wherein said coupler includes a shafted fastener received in said mount.

17. The information display as defined in claim 1, wherein said coupler includes a slide fastener engaging a cooperating element on said mount.

18. The information display as defined in claim 1, wherein said coupler includes an attachment member for snapping said housing onto said mount.

19. The information display as defined in claim 1, wherein said coupler includes an attachment member for snapping said housing onto said interior rearview mirror assembly.

20. The information display as defined in claim 1, wherein said interior rearview mirror assembly includes at least one of a map light and an automatic dimming circuitry.

21. The information display as defined in claim 1, wherein said interior rearview mirror assembly includes electrochromic elements.

22. An information display assembly for use in association with an interior rearview mirror assembly in a vehicle, said information display comprising, a module defined by a housing separate and apart from said interior rearview mirror assembly, said housing including a first portion adapted for attachment to said interior rearview mirror assembly, a coupler for engaging a mount supporting said interior rearview mirror assembly having a tab at one end for catching said mount and a clip at another end to engage a portion of said interior rearview mirror assembly, and a display element disposed within said module, said interior rearview mirror assembly having a peripheral edge, said module located behind, and separate from said rearview mirror assembly such that said display element is exposed by said peripheral edge of the rearview mirror assembly and observable by an operator.

23. The information display assembly as defined in claim 22, wherein said module is located behind and at least partially concealed by said rearview mirror assembly from the operator.

24. The information display assembly as defined in claim 22, wherein said module is located behind and substantially concealed by said rearview mirror assembly from the operator.

25. The information display assembly as defined by claim 22, wherein said module is attached to a structure supporting said rearview mirror assembly in the vehicle.

26. The information display assembly as defined in claim 22, wherein said housing includes:

a lobe extending beyond said peripheral edge of said rearview mirror assembly to be seen by the operator.

27. The information display assembly as defined in claim 26, wherein said housing includes first and second portions joined together to define an interior chamber.

28. The information display assembly as defined in claim 26, further including:

a circuit in said housing for powering said display element; and a conductor means for connecting said circuit to a power source.

29. The information display assembly as defined in claim 28, wherein said circuit includes a clock.

30. The information display assembly as defined in claim 28, wherein said circuit includes a thermometer.

31. The information display assembly as defined in claim 28, wherein said circuit includes a trip computer.

32. The information display assembly as defined in claim 28, wherein said circuit includes a compass.

33. The information display assembly as defined in claim 28, wherein said circuit includes a global satellite system.

34. The information display assembly as defined in claim 28, wherein said circuit includes an indicia.

35. The information display assembly as defined in claim 28, wherein said circuit includes a warning light.

36. The information display assembly as defined in claim 28, wherein said display element includes a liquid crystal display.

37. The information display assembly as defined in claim 28, wherein said display element includes a light-emitting diode.

38. The information display assembly as defined in claim 28, wherein said display element includes a fluorescent element.

39. The information display assembly as defined in claim 28, wherein said display element includes at least one of an analog display and a digital display.

40. The information display assembly as defined in claim 22, wherein said interior rearview mirror assembly includes at least one of a map light and an automatic dimming circuitry.

41. The information display assembly as defined in claim 22, wherein said interior rearview mirror assembly includes an electrochromic element.

42. An information display assembly for use in a vehicle having a windshield comprising:

a mount adapted to be attached to an interior of the vehicle proximate the windshield;

said mount including a button adapted to be adhered to an interior surface of the windshield;

a coupler attached to said button and having a ball member extending therefrom;

a support arm pivotally attached to said ball member at one end and pivotally attached to said rearview mirror assembly at an opposite end;

an interior rearview mirror assembly pivotally coupled to said support arm to permit adjustment of said rearview mirror assembly; and a module disposed behind and separate from said rearview mirror assembly and attached to said mount, said module having a lobe containing an information display.

43. The information display as defined in claim 42, wherein said lobe extends beyond a peripheral edge of said interior rearview mirror assembly.

44. The information display as defined in claim 43, wherein said lobe extends beyond a lower peripheral edge of said interior rearview mirror assembly.

45. The information display assembly as defined in claim 43, wherein said module is also attached to said ball member.

46. The information display assembly as defined in claim 42, wherein said module includes:

a first element; and said lobe containing a display window therein.

47. The information display assembly as defined in claim 46, wherein said information display is positioned within said display window; said module further including a circuit interconnected to said information display for providing power thereto.

48. The information display assembly as defined in claim 47, wherein said information display is at least one of a digital display and an analog display.

49. The information display assembly as defined in claim 48, wherein said information display includes a light-emitting diode display.

50. The information display assembly as defined in claim 48, wherein said information display includes a vacuum fluorescent display.

51. The information display assembly as defined in claim 47, wherein said information display includes a liquid crystal display.

52. The information display assembly as defined in claim 47, wherein said circuit includes at least one device selected from the group of devices consisting essentially of compasses, odometers, clocks, trip computers, global satellite positioning systems, cellular telephones, supplemental vision systems, warning lights, turn indicators, hazard warning indicators, speed indicators, and indicia.

53. The information display assembly as defined in claim 42, wherein said interior rearview mirror assembly includes at least one of a map light and an automatic dimming circuitry.

54. The information display assembly as defined in claim 42, wherein said interior rearview mirror assembly includes an electrochromic element.

55. The combination of an interior rearview mirror assembly for a vehicle and an information display assembly for use with said rearview mirror assembly in the vehicle, comprising:

a module, an attachment assembly mounting said module in the vehicle such that said module is behind, separate from, and substantially concealed by said interior rearview mirror assembly, said module having a display window extending from behind said rearview mirror assembly and being observable by an operator of the vehicle, said attachments assembly including a button adhered to an interior surface of the vehicle, a coupler attached to said button and having a ball member extending therefrom, and a support arm pivotally attached to said ball member at one end and pivotally attached to said interior rearview mirror assembly at an opposite end.

* * * * *

UNITED STATES PATENT AND TRADEMARK OFFICE
CERTIFICATE OF CORRECTION

PATENT NO. : 5,576,687 Page 1 of 1
DATED : November 19, 1996
INVENTOR(S) : Rodney K. Blank et al.

It is certified that error appears in the above-identified patent and that said Letters Patent is hereby corrected as shown below:

Column 1,
Line 44, "boundary;" should be -- boundary, --

Column 4,
Line 3, "from" should be -- front --.
Line 20, "from," should be -- front, --.

Column 6,
Line 19, "glassor" should be -- glass or --.

Column 8,
Line 50, "245,247" should be -- 245, 247 --.

Column 10,
Line 67, "rear-view" should be -- rearview --.

Signed and Sealed this

Thirty-first Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 5,576,687  
DATED : November 19, 1996  
INVENTOR(S) : Rodney K. Blank et al.

It is certified that error appears in the above-identified patent and that said Letters Patent is hereby corrected as shown below:

Column 1,  
Line 44, "boundary;" should be -- boundary, --

Column 4,  
Line 3, "from" should be -- front --.  
Line 20, "from," should be -- front, --.

Column 6,  
Line 19, "glassor" should be -- glass or --.

Column 8,  
Line 50, "245,247" should be -- 245, 247 --.

Column 10,  
Line 67, "rear-view" should be -- rearview --.

Column 11,  
Line 1, "couple" should be -- coupler --

Column 14,  
Line 35, "attachments" should be -- attachment --

This certificate supersedes Certificate of Correction issued December 31, 2002.

Signed and Sealed this

Twenty-second Day of July, 2003

JAMES E. ROGAN  
*Director of the United States Patent and Trademark Office*